March 7, 1961 M. GENSER 2,974,072

SEMICONDUCTOR CONNECTION FABRICATION

Filed June 27, 1958

INVENTOR
MILTON GENSER

BY Alvin J. Riddles
ATTORNEY 2,974,072

SEMICONDUCTOR CONNECTION FABRICATION

Milton Genser, Linden, N.J., assignor to International Business Machines Corporation, New York, N.Y., a corporation of New York Filed June 27, 1958, Ser. No. 745,156

1 Claim. (Cl. 148—1.5)

This invention relates to semiconductor devices and in particular to improved alloy connections for semiconductor devices.

It has become established in the art that the useable frequency range of an alloy semiconductor device is frequently limited by capacitance associated with the alloy connection. This capacitance appears in the transition region between the semiconductor crystal and the recrystallized region of the alloy connection. The magnitude of the capacitance is governed by the number of conductivity type directing impurity centers in the semiconductor crystal in the immediate vicinity of the junction formed by the alloy connection.

What has been discovered is a technique of forming an alloy connection to a semiconductor crystal wherein a region of very low conductivity is positioned between the recrystallized region and the semiconductor crystal.

One object of this invention is to provide an improved alloy connection to semiconductor material.

Another object of this invention is to provide a method of controlling conductivity in semiconductor material in the vicinity of an alloy semiconductor junction.

Another object of this invention is to provide an alloy semiconductor connection having a region of high resistivity semiconductor material positioned between the crystal and the recrystallized region.

Another object of this invention is to provide an improved N-I-P type semiconductor structure.

Other objects of the invention will be pointed out in the following description and claim and illustrated in the accompanying drawings, which disclose by way of example, the principle of the invention and the best mode, which has been contemplated, of applying that principle.

Figure 1:
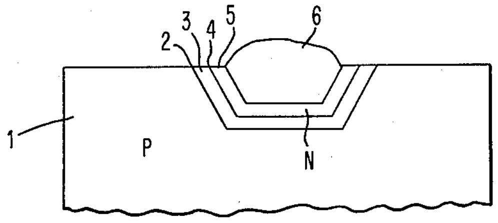
Figure 1 is a view showing the details of the alloy semiconductor connection.

Referring now to Figure 1, a semiconductor crystal 1 of semiconductor material is shown which may, for example, be germanium or silicon semiconductor material. The crystal 1 is given an arbitrary conductivity designation of P type and to one surface thereof an alloy connection is made. The alloy connection comprises a line of demarcation 2 defining a region of high resistivity, nearly intrinsic, semiconductor material 3, a second line of demarcation 4 defining a recrystallized region 5 of semiconductor material of the opposite conductivity type, which, in order to be compatible with the arbitrary designation of P type for the crystal 1, is labelled N, and a quantity of alloy material 6 which is positioned in the center of the alloy connection.

The crystal 1 is shown broken on one edge to illustrate the fact that this connection may be made to a portion of a larger semiconductor device so that as many structures as desired may be fabricated and, for example, the connection may be positioned with respect to another rectifying semiconductor connection within the diffusion distance during the carrier lifetime of the semiconductor material and thereby give transistor action.

The structure of the alloy connection of this invention is closely analogous to a P-I-N structure or the conductivity converse, the N-I-P structure well known in the art, wherein a region of very high resistivity or intrinsic semiconductor material is positioned between regions of opposite conductivity type. The region of very high resistivity is a region in which there is a reduced number of conductivity type directing impurity centers in the semiconductor material. Since the capacitive effect of a junction, with such a region in it, is influenced by the number of conductivity type directing impurity centers in the immediate vicinity of the junction, the capacitive effect is then controllable and reducible to very small values, through the technique of this invention.

Figure 2:
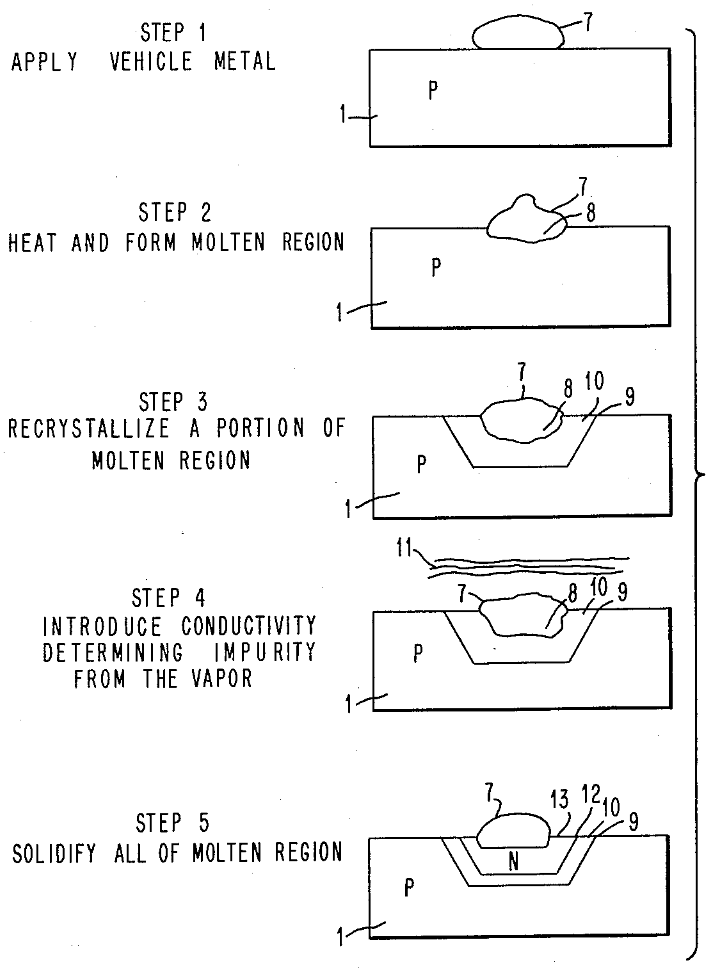
Figure 2 is an illustrated flow chart showing the steps in producing the alloy semiconductor connection.

Referring now to Figure 2, an illustrated flow chart of the method of manufacture of the connection shown in Figure 1 is provided. In Figure 2, in a first step, a quantity of a vehicle or solvent metal is applied to the semiconductor crystal 1. The vehicle or solvent metal can be any metal which is inert or relatively inert with respect to conductivity type directing impurities to be used in the semiconductor material of the crystal 1 and is capable of forming an alloy with the crystal 1 at a temperature lower than the melting point of the crystal 1 so that the metal, when molten, will fuse and dissolve a portion of the crystal 1 forming a molten region.

In a second step, a heating cycle is applied to the combination of the vehicle or solvent metal 7 and crystal 1 so that as shown by the illustration connected with step 2, the metal 7 fuses and forms a molten pool 8 comprising an alloy of the metal 7 and the material of semiconductor crystal 1.

In step 3 the temperature in the heating cycle is reduced a predetermined amount so that a portion of the material in the molten pool 8 is recrystallized and a region of semiconductor material is regrown on the original crystal 1. The beginning of this regrown region is indicated by a line of demarcation 9 and the recrystallized region itself is indicated by 10. Since the temperature was decreased only a predetermined amount, a portion of the original molten pool 8 remains.

In step 4, while the temperature is maintained at a value so that a portion of the molten pool comprising an alloy of the metal 7 and the crystal 1 remains, the environment over the crystal and the molten metal is altered so that the molten material is expressed to a vapor 11 containing a conductivity type directing impurity of a type desired for the particular device being fabricated. These impurities enter the molten material 8 from the vapor 11 in a concentration dependent upon the concentration of the impurity in the vapor 11. Through control of the temperature and concentration, ultimate control of resistivity in the device is achieved since once the impurities are absorbed in the molten region 8, the diffusion and segregation coefficients of the materials involved provide the desired control on cooling.

In step 5, the temperature is reduced until all of the molten region 8 is solidified. Since the molten pool 8 had been supplied from the vapor, with a quantity of conductivity type determining impurities in a concentration sufficient to override the conductivity type directing impurities already present, the recrystallized region formed when the molten pool 8 solidifies will now be of a conductivity type opposite to that of the original crystal 1 so that the structure now in the original crystal 1 as indicated in the illustration, will be the recrystallized region 10 beginning at a line of demarcation 9, the region 10 being essentially swept free of conductivity type determining impurities. A recrystallized region 13 is positioned within the region 10 beginning at a line of demarcation 12, which contains a predominance of conductivity type impurities of the type opposite to those in the original crystal 1 and therefore, region 13 is of an opposite conductivity type. A small portion of the original metal 7 is shown in the center of the recrystallized region 13, which may serve as an ohmic contact in a device. The structure in the illustration associated with step 5 of Figure 2 then corresponds to the structure of Figure 1 such that the button 6 corresponds to the element 7 in step 5 of Figure 2. The recrystallized N region 5 of Figure 1 corresponds to the recrystallized region 13 of step 5 of Figure 2 and the recrystallized high resistivity region 3 of Figure 1 corresponds to the recrystallized region 10 in step 5 of Figure 2.

In order to aid in understanding and practicing this invention and to bring the important factors into proper perspective, the following set of specifications for the operation of providing the alloy semiconductor connection are provided. It should be understood that no limitation is to be construed by these specifications since a wide range of specific values of specifications for a single connection will readily occur to one skilled in the art. Further, the items listed are only those of importance in this particular case, and since in semiconductor technology, it is necessary to control the purity of the materials involved to values as low as one atom in 10 million, sufficient steps to preserve this degree of purity should also be taken.

| | |
|---|---|
| Crystal 1 — germanium P type conductivity | 5 ohm centimeters' resistivity. |
| Vehicle or solvent metal, pure lead: | |
| Temp. at step 2 | 700° centigrade. |
| Temp. at step 3 | 500° centigrade. Cooled from 700° at a rate of 10° per minute. |

In step 4 at 500° centigrade, a vapor of arsenic in a concentration of approximately $10^{16}$ atoms per cc. is employed.

Under the above described conditions, the connection of Figure 1 will be formed wherein the high resistivity region 3 will be the nearly intrinsic region and will be formed in the crystal 1 to a depth of approximately 0.002 inch and the N type region 5 will have a thickness of approximately 0.004 inch.

What has been described as a technique of alloy semiconductor connection fabrication which provides a degree of control of the grading of the resistivity through a control of the number of impurity centers in the semiconductor crystal in the immediate vicinity of the junction so that the breakdown and capacitive effects of the junction are controllable. This is accomplished by sweeping the impurities out of one region, recrystallizing and introducing quantities of the opposite conductivity type determining impurities from a vapor environment.

Through the two step recrystallization in cooperation with the introduction conductivity determining impurities from the vapor in the second step, a zone refining operation takes place in the first step so that the impurity content of the semiconductor material in the first recrystallized region is so low that the material is essentially intrinsic, and, through a control of the speed of recrystallization and the point at which it is stopped, the thickness of the region and the impurity gradient and quantity in the region are brought under control. The control of each of these parameters makes possible device fabrication having particular characteristics.

As one example of a device, considering the connection of Figure 1 as made to the opposite side of a crystal having a similar connection, an alloy transistor would be provided so that a control of the intrinsic region would reduce the collector junction capacitance markedly and thereby improve the frequency response of the device.

In another example, assuming the broken region of the crystal of Figure 1, were replaced by a diffused junction, and that the alloy connection in Figure 1 were to serve as the emitter. In this case the intrinsic region would be made fairly thin with a relatively steep gradient as previously mentioned in connection with Figure 2 by appropriate variation of concentration and thickness so that the reverse breakdown of the alloy connection would be held within desired limits and still retain the injection efficiency known in the art as gamma ($\gamma$), which is desirable.

It will be apparent that only process steps involving the actual formation of the semiconductor connection have been described here and that further fabrication operations for particular devices such as etching and base tab attachments will be necessary in order to fabricate particular types of semiconductor devices such as transistors, diodes and photo cells.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claim.

What is claimed is:

The process of providing a rectifying connection to semiconductor material, comprising the steps of providing a quantity of inert lead in contact with a P conductivity type germanium semiconductor body, raising the temperature of said lead and said germanium body to 700° centigrade, reducing the temperature of said lead and said semiconductor body to 500° centigrade, exposing said semiconductor body and the remainder of said lead to a vapor comprising N conductivity type determining impurities, while maintaining the temperature at 500° centigrade and cooling said semiconductor body and said lead to room temperature.

References Cited in the file of this patent

UNITED STATES PATENTS

| | | |
|---|---|---|
| 2,849,343 | Kroger et al. | Aug. 26, 1958 |
| 2,854,366 | Wannlund et al. | Sept. 30, 1958 |